United States Patent [19]

Gillery

[11] 4,194,022
[45] Mar. 18, 1980

[54] TRANSPARENT, COLORLESS, ELECTRICALLY CONDUCTIVE COATING

[75] Inventor: Frank H. Gillery, Allison Park, Pa.
[73] Assignee: PPG Industries, Inc., Pittsburgh, Pa.
[21] Appl. No.: 935,223
[22] Filed: Aug. 21, 1978

Related U.S. Application Data

[63] Continuation of Ser. No. 818,360, Jul. 25, 1977, abandoned.
[51] Int. Cl.² .................. B05D 5/12; B05D 3/04; B05D 3/10
[52] U.S. Cl. .................. 427/109; 427/124; 427/154; 427/163; 427/255.6; 427/255.7; 427/331; 427/343; 427/384
[58] Field of Search .............. 427/109, 154, 155, 156, 427/384, 163, 248 H, 248 J, 343, 331, 124

[56] References Cited

U.S. PATENT DOCUMENTS

| Re. 26,857 | 4/1970 | Auwarter | 427/109 |
|---|---|---|---|
| 3,309,302 | 3/1969 | O'Heil | 427/109 |
| 3,698,946 | 10/1972 | Kaspaul et al. | 427/109 |
| 3,962,488 | 6/1976 | Gillery | 427/109 |
| 4,017,661 | 4/1977 | Gillery | 428/412 |

FOREIGN PATENT DOCUMENTS

46-11596  3/1971  Japan ..................... 427/164

*Primary Examiner*—Michael F. Esposito
*Assistant Examiner*—Richard Bueker
*Attorney, Agent, or Firm*—Donna L. Seidel

[57] ABSTRACT

A method for making an optically clear, colorless, transparent, electrically conductive coating by vacuum deposition is disclosed. The method involves depositing a first layer of titanium suboxide, a second layer of silver or gold, and a third layer of titanium suboxide, and treating the coating with an oil, wax, or other organic material before exposure to an ordinary atmosphere of air in order to control the rate of subsequent oxidation of the titanium suboxide. The coating deposited on a rigid transparent substrate such as glass or plastic, or on a flexible transparent plastic substrate subsequently laminated to a rigid transparent substrate, is useful for electrically heating windows.

7 Claims, 4 Drawing Figures

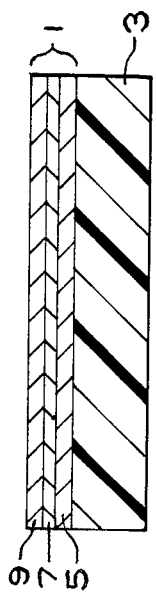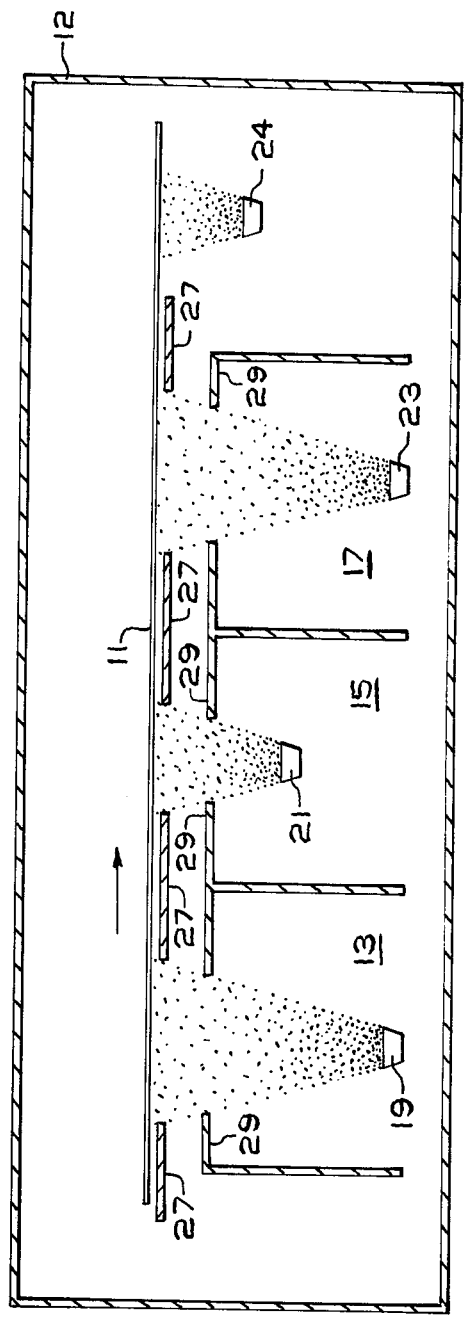

TRANSPARENT, COLORLESS, ELECTRICALLY CONDUCTIVE COATING

This is a continuation of application Ser. No. 818,360 filed July 25, 1977, now abandoned.

BACKGROUND OF THE INVENTION

1. Field of the Invention

The invention relates generally to electrically conductive coatings and more particularly to the vacuum deposition of such coatings on a transparent rigid substrate or on a flexible plastic substrate to be laminated thereto, for use as heated windows, especially in automobiles or aircraft.

2. Description of the Prior Art

U.S. Pat. No. 3,698,946 to Kaspaul et al discloses coatings comprising a first layer of titanium monoxide, a second layer of copper, silver, gold, platinum, or tin, and a third layer of titanium monoxide. The coated articles are useful as photodetectors, light emitting devices, image converters and image amplifiers. While the coated articles are described as transparent and electrically conductive, the transmittances of 38 to 76 percent and resistances of 1600 to 200,000 ohms per square are unsuitable for certain applications such as motor vehicle windows which require a high transmittance, 75 to 80 percent or higher, and very low resistance, preferably less than 10 ohms per square, to develop useful amounts of heat with available generator voltages. In addition, the titanium monoxide imparts a blue color to transmitted light.

U.S. Pat. No. 3,962,488 to Gillery teaches a method for making a colorless, highly transparent coating which also has excellent conductivity, the resistance being less than 10 ohms per square. Gillery discloses that the substitution of titanium dioxide for the monoxide of Kaspaul eliminates the color and transparency problems. However, direct deposition of titanium dioxide is incompatible with the intermediate conductive layer. An intermediate silver film, for example, which is intially continuous and highly conductive becomes discontinuous, resulting in a marked increase in resistance and decrease in transmittance in less than 24 hours. Gillery's invention involves depositing the titanium oxide layers as $TiO_x$ wherein x is greater than 1.0 but less than 2.0. While the coating may intially be somewhat colored, it becomes colorless upon exposure to a normal atmosphere of air or when subjected to the conditions of lamination as the titanium suboxide is oxidized.

Films of titanium suboxide such as described above, made by reactive vacuum evaporation of titanium metal, are extremely active and tend to oxidize extremely rapidly when air is admitted to the vacuum chamber. While such reactivity is desirable, since oxidation to the colorless dioxide is the object of the Gillery invention, the heat produced by such a rapid reaction, as well as the rapid change in volume of the titanium oxide film affect the properties of such film and also the properties of the adjacent electroconductive film. For example, the expansion or heat generated by the oxidation of the titanium suboxide may be sufficient to disrupt the continuity of the adjacent electroconductive film, making it less conductive.

SUMMARY OF THE INVENTION

The present invention provides a method for making a transparent, colorles, electrically conductive coating by vacuum deposition. The method involves vacuum deposition of a film of titanium oxide, $TiO_x$ wherein x is greater than 1.0 but less than 2.0; vacuum deposition of a continuous, transparent, electroconductive film of silver or gold; vacuum deposition of a second film of $TiO_x$ wherein x is greater than 1.0 but less than 2.0; treatment of the coating with the vapor of an oil, wax, heavy organic alcohol or amine, and exposure of the coated article to a normal atmosphere of air or to typical laminating conditions to oxidize the $TiO_x$ to $TiO_2$.

The vapor of oil, wax, heavy organic acid or amine reacts with the film surface under vacuum to pacify the film; that is to decrease the reactivity of the film so that the oxidation of the titanium suboxide proceeds substantially to completion at a slower rate, nondisruptively. Visible signs of oxidation are observed in about one hour after exposure of the coating to an ordinary atmosphere of air. Oxidation proceeds substantially to completion in about one day compared with essentially instantaneous complete oxidation of an untreated coating.

BRIEF DESCRIPTION OF THE DRAWINGS

FIG. 1 is a cross-sectional view of a substrate coated by the method of the invention.

FIG. 2 is an elevated cross-sectional view of a vacuum chamber for depositing a coating according to the invention.

Figure 3:
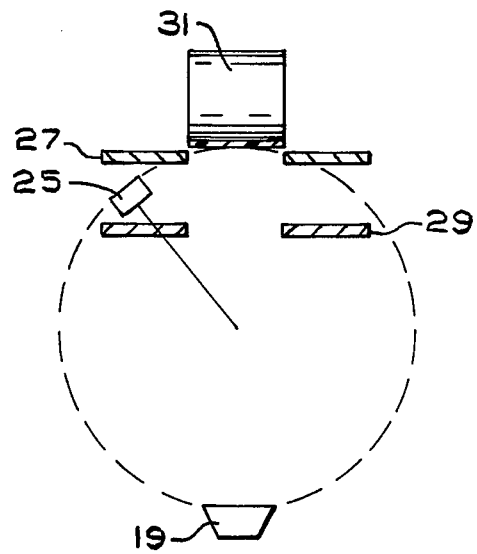
FIG. 3 is an end elevational view showing that portion of the vacuum chamber for depositing titanium oxide coatings according to the invention.

DETAILED DESCRIPTION OF THE DRAWINGS AND THE PREFERRED EMBODIMENTS OF THE INVENTION

FIG. 1 shows in cross-section a transparent electrically conductive coating 1 on a substrate 3 according to the present invention. The coating thickness has been greatly exaggerated for the purpose of illustration.

The substrate 3 can be selected from a variety of materials and the choice will be governed principally by the end use desired and by the compatability between the coating and the substrate. Good substrates for use in vacuum coating must be nonstretchable to avoid cracking the coating and non-outgassing, that is they should not contain excessive amounts of volatile materials such as plasticizers, water vapor or absorbed gases. The film being deposited should also adhere well to the substrate surface. Generally the coating of the invention adheres well to glass, ceramics, rigid plastics and certain flexible plastics such as polyesters, cast acrylics, polycarbonates, chlorinated plastics and epoxies. On the other hand, polyurethanes and polyvinyl acetals are generally too soft and extensible for vacuum deposition of conductive coatings. The preferred substrates in the present invention are either rigid transparent materials such as glass, or nonextensible flexible plastic materials such as linear polyesters, for example, polyethylene terephthalate.

The coating 1 is a composite comprising a base layer 5 deposited as $TiO_x$, where x has a value greater than 1.0 but less than 2.0, preferably within the range of 1.3 and 1.7; a second layer 7 of silver or gold; and a third layer 9 deposited as TiO$_x$, where x has a value greater than 1.0 but less than 2.0 preferably within the range of 1.3 to 1.7.

The titanium oxide layers 5 and 9 have a particular combination of properties which contribute to the overall success of the composite coating. First the titanium oxide layer 5 forms a film on which the thin silver or gold electroconductive metal layer 7 forms and remains as a continuous film. A normal state of such thin transparent silver or gold films is a discontinuous globular form. Second the titanium oxide has a high refractive index which enables it to reflect sufficient energy out of phase with the silver or gold that the combination becomes anti-reflective, highly transmitting. The titanium oxide base layer 5 adheres extremely well to glass and relatively well to flexible plastics so that the coating is durable. Finally the titanium oxide overcoat 9 is a hard material which protects the underlying electroconductive silver or gold layer from abrasion or other damage.

The degree of oxidation of the titanium oxide upon deposition can be determined visually. Thus, when the titanium oxide layers are initially applied they transmit a uniform blue color which quickly clears or becomes colorless upon exposure of the coated substrate to a normal atmosphere of air. When the substrate is glass, heating in air about 250° C. is desirable to clear the coating. This is because the glass and the intermediate metal layer acts as a diffusion barrier for the oxygen. However, when the substrate is an oxygen-permeable material such as a linear polyester, heating is not necessary and the base layer of titanium oxide will oxidize spontaneously at room temperature. If the film does not clear upon exposure to air, the film is too highly reduced. Such a film will not give the desired luminous transmittance necessary for motor vehicle glazing applications. If the titanium oxide base layer deposits as a transparent colorless film, the film is too highly oxidized and the coating will not have the properties required to nucleate the intermediate film to form a stable continuous electroconductive layer.

Besides visual observation, the degree of oxidation of the TiO$_x$ can be determined with a quartz crystal monitoring system. Quartz crystals are used for monitoring evaporation rate and film thickness during vacuum deposition. The crystals when energized vibrate at a certain frequency which changes in response to the mass of material deposited on the crystal. Knowing the original frequency of vibration and how the frequency changes in response to deposited means, the mass of material deposited on the crystal can be determined. This principle can be used to calculate the degree of oxidation of the titanium oxide coating being deposited. The mass of titanium oxide vacuum deposited on the crystal can be determined by the change in frequency of vibration of the crystal.

After the last layer of titanium suboxide has been deposited, containers 24 of the pacifying agent are heated to produce a moderate vapor pressure of oil, wax, heavy organic acid or amine in the chamber to pacify the film, that is to decrease the reactivity of the film so that the subsequent oxidation of the titanium suboxide proceeds at a nondisruptive rate. Then vacuum is broken and air is introduced into the vaccum chamber. The air will oxidize the titanium oxide coating on the crystal to titanium dioxide, increasing the mass on the crystal which can be determined by the change in the frequency of vibration of the crystal. The oxidation which occurs is depicted as follows:

$$TiO_x + \tfrac{1}{2}(2-x)O_2 \rightarrow TiO_2$$

Since the masses of TiO$_x$ and TiO$_2$ are known and the value of $\tfrac{1}{2}(2-x)O_2$ can be calculated, the value of x can be readily determined.

The thickness of the titanium oxide layers should be within the range of 200 to 500 Angstroms to obtain the desired optical properties and film continuity necessary for a commercially acceptable product. Titanium oxide layers less than 200 Angstroms or greater than 500 Angstroms in thickness result in low luminous transmittance. The titanium oxide coatings should be of a specific thickness so that interferometrically they, in combination with the intermediate metallic layer, give high luminous transmittance.

Silver or gold is chosen as the second metal layer 7 in the composite coating because of good electrical conductivity and low luminous absorption. Metals other than silver or gold and the alkali metals have high luminous absorption cause by interband electron transitions in the visible range. Thus, before the film becomes thick enough to give sufficient conductivity it is already too optically dense to be acceptably transparent for applications such as automobile or aircraft glazing. Alkali metals are not useful for conductive coatings because of their high reactivity.

For high conductivity and high luminous transmittance, the silver or gold film should be continuous. Even very slight discontinuity in the film results in a drastic decrease in electrical conductivity and luminous transmittance. To achieve the necessary continuity the intermediate metal film should have a thickness of at least about 40 Angstroms for a gold film and preferably about 60 Angstroms for a silver film. Thinner films become unstable, and decrease in electrical conductance and luminous transmittance over a period of time. The intermediate metal film thickness, however, should not significantly exceed 250 Angstroms since thicker films have too low a luminous transmittance for motor vehicle transparencies. The continuity and high conductivity of the conductive metal layer is preserved by the method of the present invention for lowering the oxidation rate of the titanium oxide layers.

The individual layers of the coating can be deposited on the substrate by vacuum coating techniques well known in the art such as vacuum evaporation or sputtering, as described in U.S. Pat. No. 3,962,488 to Gillery, U.S. Pat. No. 3,970,660 to Gillery, U.S. Pat. No. 2,665,223 to Clough et al and U.S. Pat. No. 2,971,862 to Baer et al. For vacuum coating the substrate is positioned in an air-tight coating chamber and the chamber is evacuated.

For best results, the vacuum should be below about $5 \times 10^{-4}$ Torr and preferably below $3 \times 10^{-4}$ Torr, usually within the range of 1 to $3 \times 10^{-4}$ Torr. The temperature of deposition is usually about 25° C. Deposition can be accomplished over the temperature range of about 25° to 200° C., the maximum temperature of deposition being governed by the thermal stability of the substrate and the tendency of the silver or gold to agglomerate at temperatures much above 200° C. When depositing on heat-deformable polyester sheeting, the temperature of deposition should be low, about 25° to 80° C.

Deposition of the titanium oxide is accomplished by vaporizing either titanium metal or titanium monoxide from a suitable source such as a tungsten boat or a water-cooled electron beam gun crucible in a partial pressure of oxygen. Evaporation is continued until a titanium oxide film of the desired thickness is deposited. The thickness is determined by the use of a quartz crystal monitor, which indicates the thickness directly as it is being formed. Titanium monoxide vaporizes well and the rate of evaporation can be controlled by monitoring the oxygen pressure which can initially be set at about 2.5 to $2.8 \times 10^{-4}$ Torr., which drops to about 1.8 to $2.0 \times 10^{-4}$ Torr during evaporation. However, titanium monoxide is expensive and presents difficulties in recharging the evaporation source during a long running continuous operation. Therefore, evaporation of titanium metal is preferred. Titanium metal is easy to evaporate in oxygen at about the same partial pressure of oxygen as titanium monoxide but using a slightly slower evaporation rate.

The rate at which the underlying titanium oxide layer is deposited has to be closely controlled consistent with oxygen pressure. If the rate is too fast, a highly reduced form of the oxide results which is blue in transmission and which cannot be subsequently oxidized. To achieve a slower deposition rate, the titanium source is placed relatively far away from the substrate to get deposition over a large area. Depending on the parameters of the system, acceptable deposition rates give titanium oxide films which are initially uniformly blue but which become clear upon subsequent exposure to air. A deposition rate which is too slow gives a film which is initially at least partly clear but which is too highly oxidized as evidenced by the instability of the intermediate conductive metal layer. For example, a silver layer will greatly increase in resistance in a short period of time when deposited over a too highly oxidized titanium oxide layer.

After the base titanium oxide layer has been deposited, the intermediate electroconductive metal layer is deposited. The deposition rate must be relatively fast for best results. The metal source should be placed as close to the ribbon as possible consistent with good uniformity. The deposition takes place over a small area so that the deposition rate is high, resulting in low specific resistance. Unless the metal deposition rate is kept above the threshold value, which depends on the parameters of the system, a discontinuous film will form resulting in high electrical resistance.

The overcoat of titanium oxide is deposited in the same manner as the first coating layer of titanium oxide. However, it should be deposited at a temperature below 200° C. to prevent agglomeration of the underlying electroconductive metal film.

After the three coating layers have been deposited, crucibles 24 containing oil, wax, heavy organic acid or amine are heated to provide a moderate vapor pressure of the oil or other pacifying agent. The vacuum is then broken and air is allowed to enter the vacuum chamber. Oxidation of the titanium oxide layers proceeds at a nondisruptive rate. Visible signs of oxidation are observed in about one hour after exposure of the coating to an ordinary atmosphere of air. Oxidation proceeds substantially to completion in about one day.

Alternatively, if a laminated article is desired, the coated sheet may be removed from the vacuum chamber, assembled with additional suitable sheet or sheets and laminated by conventional laminating techniques. The conditions of temperature and pressure used in laminating are sufficient to oxidize the titanium oxide coatings without any additional steps.

The coated articles prepared by the method disclosed above have high conductivity or low resistance and high luminous transmittance. The sheet resistance of the coated article is less than 10 ohms per square, usually within the range of 2 to 7 ohms per square and this resistance is stable over an extended period of time. That is, the increase in resistance is not more than 7 percent based on original sheet resistance after a period of 200 days. The luminous transmittance is preferably at least 75 percent.

When the substrate material is a flexible plastic sheet such as polyethylene terephthalate, the coated polyester can be used with conventional plastic innerlayer materials such as polyvinyl butyral or polyurethane and laminated with glass for motor vehicle glazing applications. Thus a thin sheet of polyethylene terephthalate coated in accordance with the invention can be positioned between two sheets of polyvinyl butyral or polyurethane and the plastic composite further laminated with at least one sheet of glass under conventional laminating conditions to form safety glass laminates. Other rigid transparent sheets, such as polycarbonate or acrylic can be used. Lamination should not affect the resistance of the coating although the visible light transmittance and reflectance will be somewhat affected. However, the luminous transmittance of the resultant laminate should be at least 70 percent which is the minimum required by the automotive industry, and preferably should be at least 75 percent. For motor vehicle glazing, the flexible plastic sheet should have a thickness from about 2 to 8 mils. The individual sheets of plastic innerlayer should have a thickness of from about 5 to 20 mils and the rigid transparent material should have a thickness of from about 60 to 302 mils.

Figure 4:
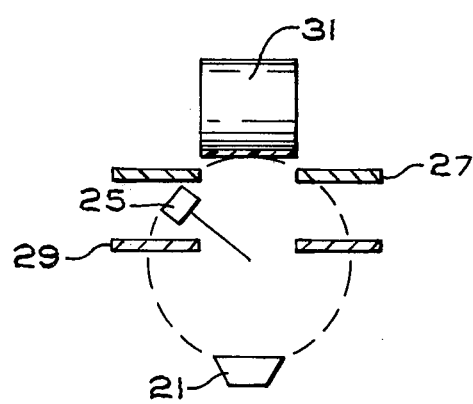
FIG. 4 is an end elevational view showing that portion of the vacuum chamber for depositing the electroconductive coating.

Referring to FIGS. 2–4, a roll of flexible plastic such as polyethylene terephthalate sheeting having a thickness of about 4 to 5 mils is coated in a vacuum chamber 12. The chamber is partitioned into three sections 13, 15 and 17. Section 13 is for depositing the base layer of titanium oxide, section 15 for depositing the intermediate electroconductive metal layer, preferably silver, and section 17 for depositing the overcoat layer of titanium oxide. The vacuum chamber is equipped with six 14 kilowatt electron beam evaporating sources (not shown) and watercooled copper crucibles 19, 21 and 23. A quartz crystal monitor and controller 25 is commonly used for controlling evaporation rate and thickness of films during vacuum deposition. The evaporation rate monitors are mounted about a circle tangent to the evaporant and the ribbon surfaces such as shown in FIGS. 3 and 4 with the monitor also tangent to the circle. This system theoretically gives the same rate of deposition on the crystal as on the ribbon. Because of scattered deposits a doubled masked system 27 and 29 is used to control the particles being deposited on the ribbon. Masks are positioned between the sources of evaporation and the ribbon to insure uniform deposits. A heatable crucible 24 contains the oil, wax, heavy organic acid or amine pacifying agent.

The chamber is evacuated to a pressure of approximately $5 \times 10^{-5}$ Torr and oxygen is fed into the chamber in the vicinity of the titanium sources 21 and 23 until a pressure of about $2 \times 10^{-4}$ Torr is established while evaporation is taking place. The water-cooled crucibles 19 and 23 are filled with titanium and crucibles 21 with silver. The electron guns are activated to heat the metal sources. A polyester ribbon is continuously driven by a motor outside the chamber from a feed roll to take up roll (rolls not shown) across the vapor sources 19, 21 and 23 at a ribbon speed preferably about 88 inches per minute.

Titanium sources 19 and 23 are placed as far away from the ribbon as possible, about 80 centimeters, and evaporation takes place over a large area. In this way deposition rate is kept low allowing the titanium metal to oxidize. On the other hand, the silver source is placed as close as possible consistent with good uniformity, about 45 centimeters from the ribbon, and evaporation takes place over a small area so that the silver deposition rate is high, giving the best film conductivity. With the existing parameters of a system generally described for FIGS. 2 through 4, a deposition rate for titanium oxide is less than 16 Angstroms per second gives a film which is clear, that is highly oxidized, resulting in instability of the electroconductive metal layer. A rate of 32 Angstroms per second gives a slightly blue transmitting film which clears upon exposure to air and which does not impar the continuity of the silver film. The deposition rate should not exceed 64 Angstroms per second. Otherwise the coating is too highly reduced, and the blue color does not sufficiently clear. A titanium oxide film of about 300–400 Angstroms thick for each layer is about an optimum thickness for minimum reflectance and intensity of color.

The silver thickness obtained in the above process is about 150–180 Angstroms. Unless the silver deposition rate is kept above about 15 Angstroms per second, the resistance tends to increase. A normal resistance value for the 150 Angstroms thick film is about 5 ohms per square. As the thickness is increased, the reflectance and transmittance colors become stronger.

Following the coating operation, the crucibles containing the pacifying agent are heated to develop a moderate vapor pressure of the pacifying agent in the vacuum chamber. Preferred pacifying agents include oil such as diffusion pump oils, waxes such as paraffin, and heavy organic acids and amines such as tetraethylene glycol and tetraethylene pentamine. Heavy organic acids and amines include those compounds with a boiling point above about 300° C., preferably in the range of #10° to 310° C. Waxes are preferred over oils because there is less wetting of the surfaces inside the vacuum chamber. Tetraethylene glycol is most preferred because it is most effective. At the low pressure existant in the vacuum chamber, the preferred temperature range for heating tetraethylene glycol is between about 50° C. and 85° C. At lower temperatures the vapor pressure is too low to develop a sufficient partial pressure of vapor to interact with the film. At higher temperatures, the tetraethylene glycol boils at typical pressures in the vacuum chamber. After the pacifying agent has reacted with the coating, the vacuum is broken and air is allowed to enter the vacuum chamber. Visible signs of oxidation are observed in about one hour after exposure of the coating to an ordinary atmosphere of air. Oxidation proceeds substantially to completion in about one day.

The luminous transmittance of the resultant coated article is preferably at least about 70 percent, and more preferably 75 to 80 percent. The conductivity of the coated article is preferably less than 10 ohms per square and more preferably in the range of 2 to 7 ohms per square.

The present invention will be further understood from the description of a specific example which follows:

EXAMPLE I

A flexible transparent sheet of polyethylene terephthalate is placed in a vacuum chamber at a temperature of 21° C. The chamber is evacuated to $5 \times 10^{-5}$ Torr. Oxygen is supplied to the chamber until a partial pressure of $1.3 \times 10^{-4}$ Torr is established. A crucible containing titanium metal is heated so that tatanium is evaporated into the chamber to form a titanium oxide coating on the sheet at a rate of 75 Angstroms per second until a film of titanium oxide about 400 Angstroms thick is formed. Similarly, silver is deposited over the titanium oxide at a rate of 130 Angstroms per second until a film about 180 Angstroms thick is formed. A final film of titanium oxide about 400 Angstroms thick is deposited over the silver film. A container of tetraethylene glycol pacifying agent is then heated to evaporate sufficient pacifying agent to establish a partial pressure of about $1 \times 10^{-4}$ Torr. The coated substrate is maintained in this pacifying environment for about 15 seconds. The vacuum is broken allowing air to enter the chamber. Visible signs of oxidation of the coating appear within about an hour after exposure of the coated article to a normal atmosphere. Oxidation is substantially complete within about one day. The luminous transmittance of the coated article is 80 percent and the sheet resistance is 4 ohms per square.

The foregoing example is offered to illustrate the present invention. Variations and modifications within the scope of the invention include the use of glass, rigid transparent plastics and other flexible transparent plastics as substrates; use of a variety of oils, waxes, heavy organic alcohols or amines as pacifying agents; utilizing the lamination procedure for oxidation of the titanium suboxide, rather than waiting for the oxidation to proceed to completion in air; employing a range of partial pressures, deposition rates and so on in the vacuum coating operation; and using the coated article in architectural, as well as motor vehicle, applications. The scope of the present invention is defined by the following claims:

I claim:

1. A method for making a transparent, colorless, electroconductive coated article comprising the steps of:
   a. evacuating a vacuum chamber containing a transparent substrate to be coated;
   b. vacuum depositing in a partial pressure of oxygen a transparent film of titanium oxide, $TiO_x$ wherein x has a value greater than 1.0 and less than 2.0;
   c. vacuum depositing on the titanium oxide film a continuous, transparent, electroconductive film of a metal selected from the group consisting of gold and silver;
   d. vacuum depositing in a partial pressure of oxygen a second transparent film of titanium oxide, $TiO_x$ wherein x has a value of greater than 1.0 and less than 2.0, on the electroconductive film;
   e. establishing in the vacuum chamber an atmosphere comprising the vapor of a material selected from the group consisting of oils, waxes, heavy organic acids, alcohols and amines capable of decreasing the rate of oxidation of titanium oxide;
   f. exposing said films to said atmosphere; and
   g. oxidizing the titanium oxide constituents of the coating.

2. The method according to claim 1, wherein the titanium oxide films are deposited by the evaporation of titanium metal and the partial pressure of oxygen is in the range of 1.0 to $3.0 \times 10^{-4}$ Torr.

3. The method according to claim 1 wherein the material capable of decreasing the rate of oxidation of the titanium oxide is selected from the group consisting of paraffin wax, tetraethylene glycol and tetraethylene pentamine.

4. The method according to claim 1, wherein the substrate is selected from the group consisting of rigid transparent materials and flexible transparent plastics.

5. The method according to claim 4 wherein the substrate is glass.

6. The method according to claim 4, wherein the substrate is a polyester.

7. The method according to claim 1, wherein the thickness of the titanium oxide layers are from about 200 to 500 Angstroms and the electroconductive film is a silver film having a thickness of 60 to 250 Angstroms.

* * * * *